United States Patent
Chang et al.

(10) Patent No.: US 8,790,497 B2
(45) Date of Patent: Jul. 29, 2014

(54) PROCESS FOR SURFACE TREATING MAGNESIUM ALLOY AND ARTICLE MADE WITH SAME

(75) Inventors: Hsin-Pei Chang, New Taipei (TW); Wen-Rong Chen, New Taipei (TW); Huann-Wu Chiang, New Taipei (TW); Cheng-Shi Chen, New Taipei (TW); Dun Mao, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 164 days.

(21) Appl. No.: 13/188,556

(22) Filed: Jul. 22, 2011

(65) Prior Publication Data

US 2012/0270035 A1  Oct. 25, 2012

(30) Foreign Application Priority Data

Apr. 22, 2011  (CN) .......................... 2011 1 0101985

(51) Int. Cl.
*C23C 14/34* (2006.01)
(52) U.S. Cl.
USPC ................. 204/192.15; 204/192.12; 148/275; 148/420
(58) Field of Classification Search
USPC ................... 148/275, 420; 204/192.1–192.38
See application file for complete search history.

(56) References Cited

U.S. PATENT DOCUMENTS

| | | | | |
|---|---|---|---|---|
| 2,490,062 | A * | 12/1949 | Jernstedt .................... | 148/254 |
| 6,787,192 | B2 * | 9/2004 | Fukumura et al. .......... | 427/402 |
| 7,679,155 | B2 * | 3/2010 | Korenivski .................. | 257/421 |
| 8,289,756 | B2 * | 10/2012 | Zheng et al. ................. | 365/158 |
| 2006/0281005 | A1 * | 12/2006 | Cho et al. ................ | 429/231.95 |
| 2007/0020396 | A1 * | 1/2007 | Erretby et al. .............. | 427/294 |
| 2008/0152836 | A1 * | 6/2008 | Huang et al. ............... | 427/532 |
| 2009/0162678 | A1 * | 6/2009 | Hsu et al. ................... | 428/457 |

FOREIGN PATENT DOCUMENTS

| DE | 19756845 | A | * | 6/1999 |
|---|---|---|---|---|
| JP | 62117157 | A | * | 5/1987 |

OTHER PUBLICATIONS

Derwent Abstract 1999-358874 published Jun. 1999.*

* cited by examiner

*Primary Examiner* — John Brayton
(74) *Attorney, Agent, or Firm* — Novak Druce Connolly Bove + Quigg LLP

(57) ABSTRACT

A process for treating the surface of magnesium alloy comprises providing a substrate made of magnesium alloy. The substrate is then treated with a chemical conversion treatment agent containing ammonium dihydrogen phosphate and potassium permanganate, to form a chemical conversion film on the substrate. A ceramic coating is then formed on the chemical conversion film using vacuum sputtering.

11 Claims, 3 Drawing Sheets

PROCESS FOR SURFACE TREATING MAGNESIUM ALLOY AND ARTICLE MADE WITH SAME

CROSS-REFERENCE TO RELATED APPLICATIONS

This application is related to co-pending U.S. patent applications Ser. Nos. 13/188,561, 13/188,566, 13/188,575, each entitled "PROCESS FOR SURFACE TREATING MAGNESIUM ALLOY AND ARTICLE MADE WITH SAME", each invented by Chang et al. These applications have the same assignee as the present application. The above-identified applications are incorporated herein by reference.

BACKGROUND

1. Technical Field

The disclosure generally relates to a process for surface treating magnesium alloy, and articles made of magnesium alloy treated by the process.

2. Description of Related Art

Magnesium alloys are widely used in manufacturing components (such as housings) of electronic devices and cars because of their properties such as light weight and quick heat dissipation. However, magnesium alloys have a relatively low erosion resistance and abrasion resistance. One method for enhancing the erosion resistance of a magnesium alloy is to form ceramic coatings on its surface. However, cast magnesium alloy often has many pinholes on its surface. The ceramic coatings over these pinholes are usually thinner and weaker than other portions having no pinhole, rendering pitting corrosion more likely at these locations.

Therefore, there is room for improvement within the art.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the exemplary process for the surface treating of magnesium alloy and articles made of magnesium alloy treated by the process. Moreover, in the drawings, like reference numerals designate corresponding parts throughout the several views. Wherever possible, the same reference numbers are used throughout the drawings to refer to the same or like elements of an embodiment.

DETAILED DESCRIPTION

Figure 2:
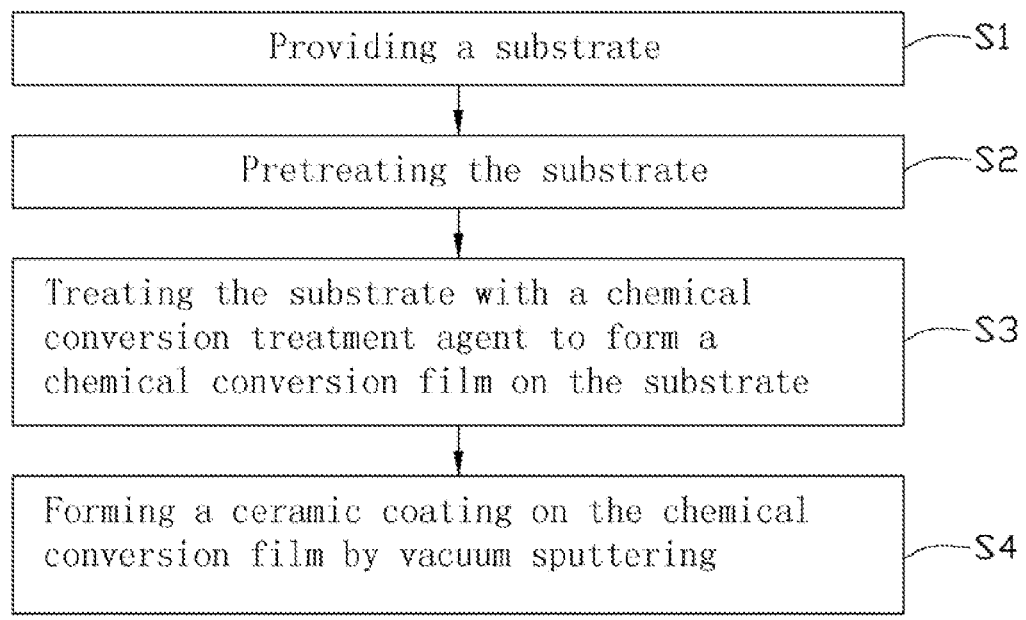
FIG. 2 is a block diagram of a process for the surface treating of magnesium alloy according to an exemplary embodiment.

Referring to FIG. 2, an exemplary process for the surface treatment of magnesium alloy may include steps S1 to S4.

Figure 1:
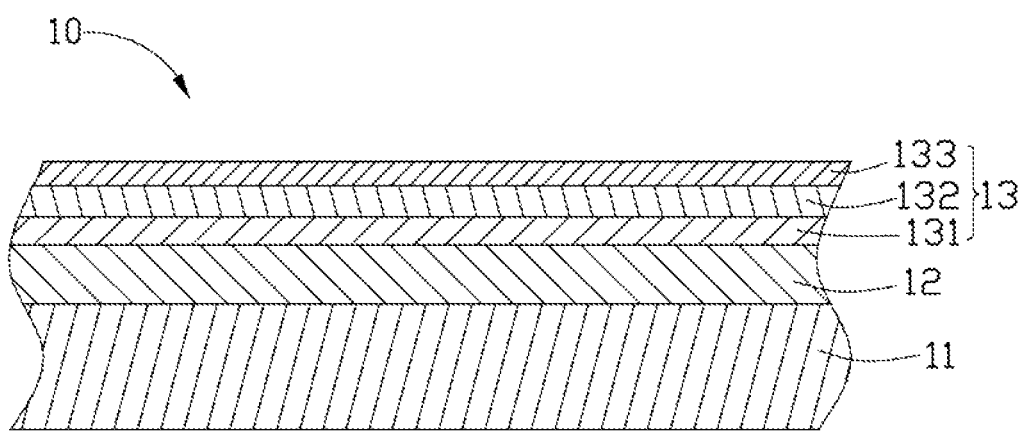
FIG. 1 is a cross-sectional view of an exemplary article treated in accordance with the present process.

In step 1, referring to FIG. 1, a substrate 11 is provided. The substrate 11 is made of a magnesium alloy, such as Mg—Al alloy, or Mg—Al—Zn alloy.

In step 2, the substrate 11 is pretreated. The pretreatment may include the following steps.

Firstly, the substrate 11 is chemically degreased with an aqueous solution, to remove impurities such as grease or dirt from the substrate 11. The aqueous solution contains about 25 g/L-30 g/L sodium carbonate ($Na_2CO_3$), about 20 g/L-25 g/L trisodium phosphate dodecahydrate ($Na_3PO_4.12H_2O$), and an emulsifier. The emulsifier may be a trade name emulsifier OP-10 (a condensation product of alkylphenol and ethylene oxide) at a concentration of about 1 g/L-3 g/L. The substrate 11 is immersed in the aqueous solution, which is maintained at a temperature of about 60° C.-80° C., for about 30 s-60 s. Then, the substrate 11 is rinsed for about 20 s-60 s.

Then, the degreased substrate 11 is etched in an alkaline etchant, to create a smooth surface and further remove any impurities thereon. The alkaline etchant is an aqueous solution containing about 40 g/L-70 g/L sodium hydroxide (NaOH), about 10 g/L-20 g/L $Na_3PO_4.12H_2O$, about 25 g/L-30 g/L $Na_2CO_3$, and about 40 g/L-50 g/L sodium fluoride (NaF). The substrate 11 is immersed in the alkaline etchant, which is maintained at a temperature of about 40° C.-50° C., for about 3 s-5 s. During this process, burrs and other small sized protrusions are dissolved.

The substrate 11 is then activated using an activating solution, to improve the bonding ability of the surface of the substrate 11 with the subsequent chemical conversion film 12. The activating solution is an aqueous solution containing nitric acid ($HNO_3$) and hydrofluoric acid (HF), in which, the weight ratio of the $HNO_3$ to the HF is about 3:1. In addition, in the activating solution, the percentage of the $HNO_3$ is about 1%-10% by weight; the percentage of the HF is about 1%-8% by weight. The substrate 11 is immersed in the activating solution at room temperature for about 3 s-20 s.

In step S3, once the pretreatment is finished, the substrate 11 undergoes a chemical conversion treatment using a chemical conversion treatment agent. The chemical conversion treatment agent can be an aqueous solution mainly containing about 60 g/L-100 g/L ammonium dihydrogen phosphate ($NH_4H_2PO_4$), about 1 g/L-40 g/L potassium permanganate ($KMnO_4$). The chemical conversion treatment agent may further contain additive. The additive contains sulfide and amine compound each having a percentage of about 10%-20% by weight.

The chemical conversion treatment agent can be brought into contact with the surface of the substrate 11. Examples of the method include an immersing method, a dipping method, a spraying method and the like. In this exemplary embodiment, the chemical conversion treatment is carried out by immersing the substrate 11 in the chemical conversion treatment agent maintained at a temperature of about 30° C. for about 20 min. By this process, anions in the chemical conversion treatment agent react with metal atoms on a surface layer of the substrate 11, thus a chemical conversion film 12 is formed on the substrate 11.

The chemical conversion film 12 is a coating resulting from the chemical reaction between anions $MnO_4^{1-}$, $H_2PO_4^{1-}$, and $OH^-$ in the chemical conversion treatment agent and metal atoms, such as Mg, Al in the substrate 11. The chemical conversion film 12 mainly comprises elements of Mg, Al, O, P, and Mn. The atomic ratio of elements Mg, Al, O, P, and Mn in the chemical conversion film 12 is respectively about (1-5):(1-5):(2-10):(1-10):(3-10). The chemical conversion film 12 is about 0.2 μm-5 μm thick.

In step S4, a ceramic coating 13 is formed on the chemical conversion film 12 by vacuum sputtering. The ceramic coating 13 may be single or multilayered. In this exemplary embodiment, the ceramic coating 13 in order includes a first layer 131 coated on the chemical conversion film 12, a second layer 132 and a third layer 133. The first layer 131 is a magnesium-oxygen compound layer. The magnesium-oxygen compound may be $Mg_xO_y$. The second layer 132 is a magnesium-nitrogen compound layer. The magnesium-nitrogen compound may be $Mg_xN_z$. The third layer 133 is a magnesium-oxygen-nitrogen compound layer. The magnesium-oxygen-nitrogen compound may be $Mg_xO_yN_z$. Each of the subscripts "x", "y", and "z" has a numerical value between about 1 and 10. The vacuum sputtering of the ceramic coating 13 may be performed in accordance with the following.

Figure 3:
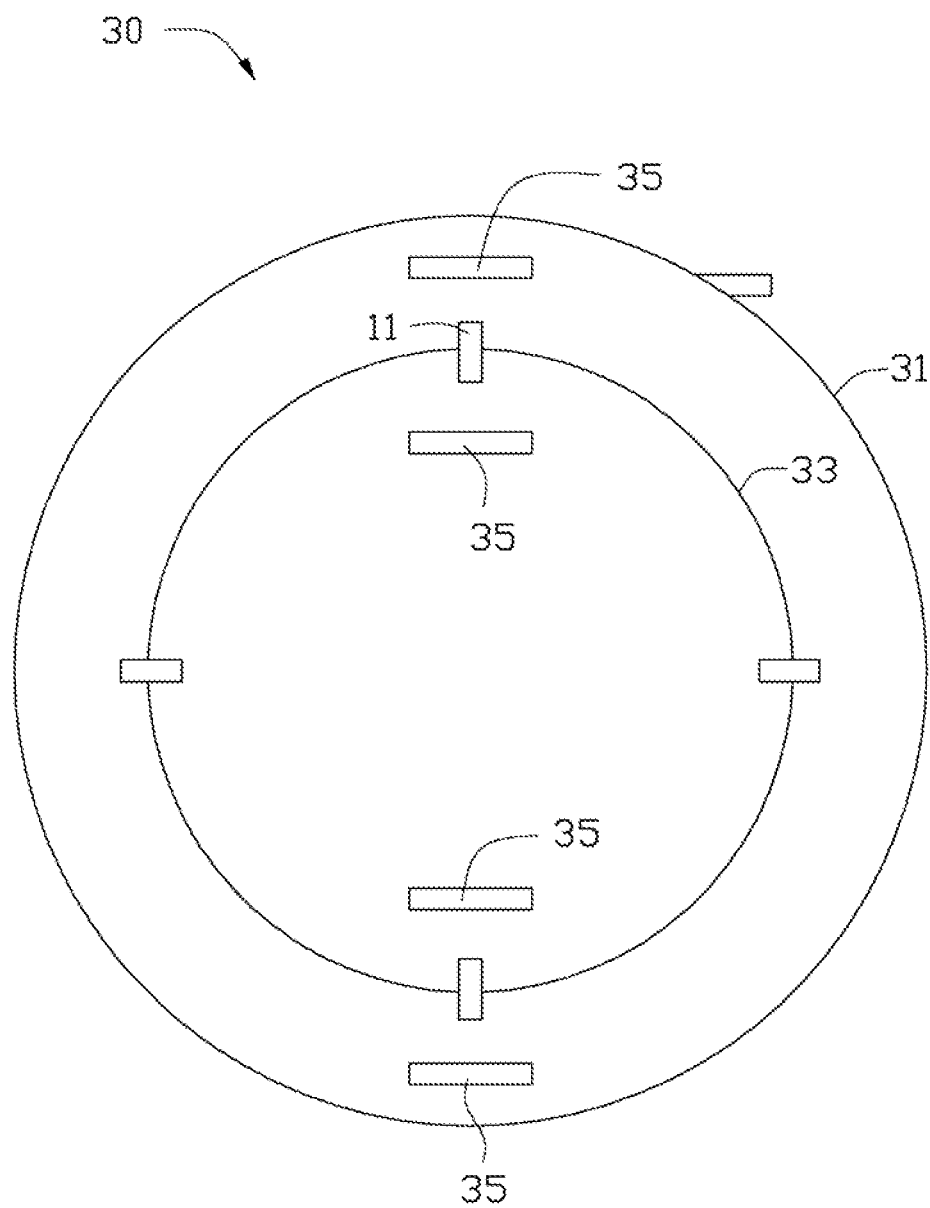
FIG. 3 is a schematic view of a vacuum sputtering machine for processing the exemplary article shown in FIG. 1.

The first layer 131 is directly formed on the chemical conversion film 12 by vacuum sputtering. The substrate 11 is held on a rotating bracket 33 in a chamber 31 of a vacuum sputtering machine 30 as shown in FIG. 3. The chamber 31 is evacuated to maintain an internal pressure of about $5\times10^{-3}$ Pa to $9\times10^{-3}$ Pa and the inside of the chamber 31 is heated to a temperature of about 120° C. The speed of the rotating bracket 33 is about 0.5 revolutions per minute (rpm). Argon and oxygen are simultaneously fed into the chamber 31, with the argon as a sputtering gas, and the oxygen as a reactive gas. The flow rate of argon is about 150 standard-state cubic centimeters per minute (sccm) to about 300 sccm. The flow rate of oxygen is about 1 sccm to 50 sccm. A bias voltage of about −150 volts (V) to about −300 V is applied to the substrate 11. About 8 kW to about 16 kW of electric power is applied to the magnesium targets 35 fixed in the chamber 31, depositing the first layer 131 on the chemical conversion film 12. Depositing the first layer 131 may take about 30 min. The power may be medium-frequency AC power.

The second layer 132 is directly formed on the first layer 131 also by vacuum sputtering. This step may be carried out in the same vacuum sputtering machine 30. The chamber 31 is evacuated to maintain a pressure of about $5\times10^{-3}$ Pa to $9\times10^{-3}$ Pa, and the inside of the chamber 31 is heated to a temperature of about 120° C. The speed of the rotating bracket 33 is about 0.5 rpm. Argon and nitrogen are simultaneously fed into the chamber 31. The flow rate of argon is about 150 sccm to about 300 sccm. The flow rate of nitrogen is about 1 sccm to about 50 sccm. A bias voltage of about −100 V to about −300 V is applied to the substrate 11. About 8 kW to about 16 kW of electric power is applied to the magnesium targets 35, depositing the second layer 132 on the first layer 131. Depositing the second layer 132 may take about 40 min.

The third layer 133 is directly formed on the second layer 132 also by vacuum sputtering. This step may be carried out in the same vacuum sputtering machine 30. The chamber 31 is evacuated to maintain a pressure of about $5\times10^{-3}$ Pa to $9\times10^{-3}$ Pa, and the inside of the chamber 31 is heated to a temperature of about 120° C. The speed of the rotating bracket 33 is about 0.5 rpm. Argon, oxygen, and nitrogen are simultaneously fed into the chamber 31. The flow rate of argon is about 150 sccm to about 300 sccm. The flow rate of oxygen is about 1 sccm to about 50 sccm, and the flow rate of nitrogen is about 1 sccm to about 50 sccm. A bias voltage of about −100 V to about −300 V is applied to the substrate 11. About 8 kW to about 16 kW of electric power is applied to the magnesium targets 35, depositing the third layer 133 on the second layer 132. Depositing the third layer 133 may take about 60 min. The total thickness of the ceramic coating 13 may be about 2 μm-5 μm.

The first layer 131 enhances the bonding of the chemical conversion film 12 to the ceramic coating 13. The chemical conversion film 12 has a good chemical stability and high compact density, with good erosion resistance. In addition, the chemical conversion film 12 provides a smooth surface on the substrate 11, and by such means the ceramic coating 13 formed on chemical conversion film 12 has a substantially even thickness, reducing the susceptibility to pit corrosion. Having a high resistance to abrasion, the ceramic coating 13 protects the chemical conversion film 12 from mechanical abrasion.

FIG. 1 shows a cross-section of an exemplary article 10 made of magnesium alloy and processed by the surface treatment process described above. The article 10 may be a housing for an electronic device, such as a mobile phone. The article 10 includes the substrate 11 made of magnesium alloy, the chemical conversion film 12 formed on the substrate 11, and the ceramic coating 13 formed on the chemical conversion film 12. The chemical conversion film 12 is formed using a chemical conversion treatment agent containing $NH_4H_2PO_4$, $KMnO_4$, and additive(s), as described above. The ceramic coating 13 in order includes the first layer 131 coated on the chemical conversion film 12, the second layer 132 and the third layer 133.

A neutral salt spray test was applied to the samples created by the present process. The test conditions included 5% NaCl (similar to salt-fog chloride levels), and the test was an accelerated corrosion test for assessing coating performance. Erosion began to be observed after about 72 hours, indicating that the samples resulting from the present process have a good erosion resistance.

It is to be understood, however, that even through numerous characteristics and advantages of the exemplary disclosure have been set forth in the foregoing description, together with details of the system and functions of the disclosure, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A process for surface treating magnesium alloy, the process comprising the following steps of:
   providing a substrate made of magnesium alloy;
   forming a chemical conversion film on the substrate by treating the substrate with a chemical conversion treatment agent containing ammonium dihydrogen phosphate and potassium permanganate; and
   forming a ceramic coating on the chemical conversion film by vacuum sputtering, wherein the ceramic coating includes a $Mg_xO_y$ layer coated on the chemical conversion film, a $Mg_xN_z$ layer coated on the $Mg_xO_y$ layer, and a $Mg_xO_yN_z$ layer coated on the $Mg_xN_z$ layer, each of the subscripts "x", "y", and "z" has a numerical value between 1 and 10.

2. The process as claimed in claim 1, wherein the chemical conversion treatment agent is an aqueous solution containing about 60 g/L- 100 g/L ammonium dihydrogen phosphate, and about 1 g/L-40 g/L potassium permanganate.

3. The process as claimed in claim 2, wherein the aqueous solution further contains additive containing sulfide and amine compound; the weight percentage of the sulfide in the aqueous solution is about 10 %-20 %; the weight percentage of the amine compound in the aqueous solution is about 10 %-20 %.

4. The process as claimed in claim 2, wherein treating the substrate with the chemical conversion treatment agent is carried out by bringing the substrate in contact with the chemical conversion treatment agent, which is maintained at a temperature of about 30° C., for about 20 min.

5. The process as claimed in claim 1, wherein the chemical conversion film results from chemical reaction between anions $MnO_4^{1-}$, $H_2PO_4^{1-}$, and $OH^-$ in the chemical conversion treatment agent and metal atoms in the substrate.

6. The process as claimed in claim 5, wherein the chemical conversion film comprises elements of Mg, Al, O, P, and Mn.

7. The process as claimed in claim 1, wherein the $Mg_xO_y$ layer is formed by vacuum sputtering, using magnesium as a target, and oxygen as a reactive gas.

8. The process as claimed in claim 1, wherein the $Mg_xN_z$ layer is formed by vacuum sputtering, using magnesium as a target, and nitrogen as a reactive gas.

9. The process as claimed in claim 1, wherein the $Mg_xO_yN_z$ layer is formed by vacuum sputtering, using magnesium as a target, and nitrogen and oxygen as reactive gases.

10. The process as claimed in claim 1, further comprising etching the substrate using an alkaline etchant containing about 40 g/L-70 g/L NaOH, about 10 g/L-20 g/L $Na_3PO_4 \cdot 12H_2O$, about 25 g/L-30 g/L $Na_2CO_3$, and about 40 g/L-50 g/L NaF, before treating the substrate with a chemical conversion treatment agent.

11. The process as claimed in claim 10, wherein the etching step is carried out by immersing the substrate in the alkaline etchant maintained at a temperature of about 40° C.-50° C. for about 3 s-5 s.

* * * * *